United States Patent [19]

Yamada

[11] Patent Number: 5,422,843
[45] Date of Patent: Jun. 6, 1995

[54] METHOD OF ERASING INFORMATION IN MEMORY CELLS

[75] Inventor: Seiji Yamada, Tokyo, Japan

[73] Assignee: Kabushiki Kaisha Toshiba, Kawasaki, Japan

[21] Appl. No.: 123,476

[22] Filed: Sep. 20, 1993

[30] Foreign Application Priority Data

Oct. 5, 1992 [JP] Japan ................... 4-265682

[51] Int. Cl.⁶ ............................................. G11C 11/40
[52] U.S. Cl. ................................. 365/185; 365/200; 365/201; 365/218; 365/900; 257/316
[58] Field of Search ............... 365/185, 218, 200, 201, 365/900; 257/316

[56] References Cited

U.S. PATENT DOCUMENTS

| | | | |
|---|---|---|---|
| 4,949,309 | 8/1990 | Rao | 365/900 |
| 5,058,068 | 10/1991 | Costabello | 305/200 |
| 5,126,808 | 6/1992 | Montalvo et al. | 365/185 |
| 5,134,449 | 7/1992 | Gill et al. | 365/218 |
| 5,185,718 | 2/1993 | Ringerson et al. | 365/185 |

Primary Examiner—Joseph E. Clawson, Jr.
Attorney, Agent, or Firm—Banner, Birch, McKie & Beckett

[57] ABSTRACT

A method of this invention is applied to a nonvolatile memory device composed of first memory cells connected to one of a first word-line pair and second memory cells connected to the other of the first word-line pair, and a single source shared by the first memory cells and the second memory cells. First, a positive potential of, for example, 5 V is applied to the source, a negative potential of, for example, −10 V is applied to the one of the word-line pair, and the ground potential to the other of the word-line pair. This permits electrons to move from the floating gate of the first memory cells into the source, with the result that the erasing of information is achieved. Next, the positive potential is applied to the source, the negative potential is applied to the other of the word-line pair, and the ground potential to the one of the word-line pair. This permits electrons to move from the floating gates of the second memory cells into the source, with the result that the erasing of information is achieved.

15 Claims, 2 Drawing Sheets

| | POTENTIAL OF SOURCE LINE Sn | POTENTIAL OF WORD LINE W2n-1 | POTENTIAL OF WORD LINE W2n |
|---|---|---|---|
| ERASURE 1 | 5V | −10V | |
| ERASURE 2 | 5V | | −10V |

WHERE n=1,2,---

| | POTENTIAL OF SOURCE LINE Sn | POTENTIAL OF WORD LINE W2n-1 | POTENTIAL OF WORD LINE W2n |
|---|---|---|---|
| ERASURE 1 | 5V | -10V | |
| ERASURE 2 | 5V | | -10V |

WHERE n=1,2,---

METHOD OF ERASING INFORMATION IN MEMORY CELLS

BACKGROUND OF THE INVENTION

1. Field of the Invention

This invention provides a means of narrowing the threshold distribution during the erasing of information in a flash EEPROM composed of memory cells of two-layer polysilicon structure.

2. Description of the Related Art

In conventional flash EEPROMs having an array structure as shown in FIG. 1, the erasing of information is achieved by extracting electrons from, for example, the floating gate to the source through Fowler-Nordheim (hereinafter, referred to as F-N) tunneling. By applying a positive potential to the source and a negative potential to the word line, the erasing is done for all the memory cells, or in blocks of memory cells, or word line by word line.

In an EEPROM as shown in FIG. 1, however, for example, two word lines W1 and W2 are arranged so as to make a pair with a source line S1 between them. Consequently, the threshold distributions of the two word lines W1 and W2 are independent of each other as shown in FIG. 2.

The difference in the threshold distribution between the two word lines W1 and W2 is ascribed to a combination of factors such as the misaligned stepper and the anisotropic processes (especially, such as ion implantation and etching). It is very difficult to eliminate the difference completely.

In that case, when all the memory cells are erased in unison or the memory cells are erased in blocks, variations in the threshold value spread in the range shown by a (broken line) in FIG. 2. As a result, the threshold distribution b of word line W1 overlaps with the threshold distribution c of word line W2.

In contrast, it is also possible to erase information word line by word line. In that case, because erasing is achieved for each word line, a range which covers all variations in the threshold value is equal to a range for a single word line (a single-dot chain line Y) as shown by e in FIG. 2. In this erasing method, however, since information is erased word line by word line, as many erasing actions as there are word lines are required. Consequently, it takes a very long time to complete the erasing operation.

As mentioned above, in conventional EEPROMs where two word lines are arranged so as to make a pair with a source line between them, because there is a difference in the threshold distribution between the two word lines during an erasing operation, when all the memory cells are erased simulaneously or memory cells are erased in blocks, this causes the disadvantage that the threshold distribution becomes wider.

SUMMARY OF THE INVENTION

It is an object of the present invention to overcome the above disadvantage by providing an erasing means of not only requiring a shorter time to erase information but also narrowing the threshold distribution during the erasing of information in a flash EEPROM composed of memory cells of two-layer polysilicon structure.

To accomplish the foregoing object, a method of erasing information in memory cells according to the present invention is applied to a nonvolatile memory device composed of first memory cells connected to one of a word-line pair, second memory cells connected to the other of the word-line pair, and a single source shared by the first memory cells and the second memory cells.

With this method, the erasing of information in the first memory cells is achieved by applying a first potential to the single source, a second potential lower than the first potential to the one of the word-line pair, and a third potential to the other of the word-line pair. After this, the erasing of information in the second memory cells is achieved by applying the first potential to the single source, the second potential to the other of the word-line pair, and the third potential to the one of the word-line pair.

A method of erasing information in memory cells according to the invention is also applied to a nonvolatile memory device composed of first memory cells connected to one of a word-line pair, second memory cells connected to the other of the first word-line pair, a single source shared by the first memory cells and the second memory cells, and an erasure electrode for erasing the information in the first memory cells and the second memory cells.

With the above method, the erasing of information in the first memory cells is done by applying a first potential to the erasure electrode, a second potential lower than the first potential to one of the word-line pair, and a third potential to the other of the word-line pair. After this, the erasing of information in the second memory cells is done by applying the first potential to the erasure electrode, the second potential to the other of the word-line pair, and the third potential to the one of the word-line pair.

By the methods described above, in erasing information in blocks of memory cells in a flash EEPROM composed of memory cells of two-layer polysilicon structure, all the information in the memory cells connected to one of the word-line pair in a block can be erased, and then all the information in the memory cells connected to the other of the word-line pair can be erased. As a result, the time required to erase information can be made shorter and the threshold distribution during the erasing of information can be made narrower.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENTS

Referring to the accompanying drawings, an embodiment of the present invention will be explained in detail.

Figure 1:
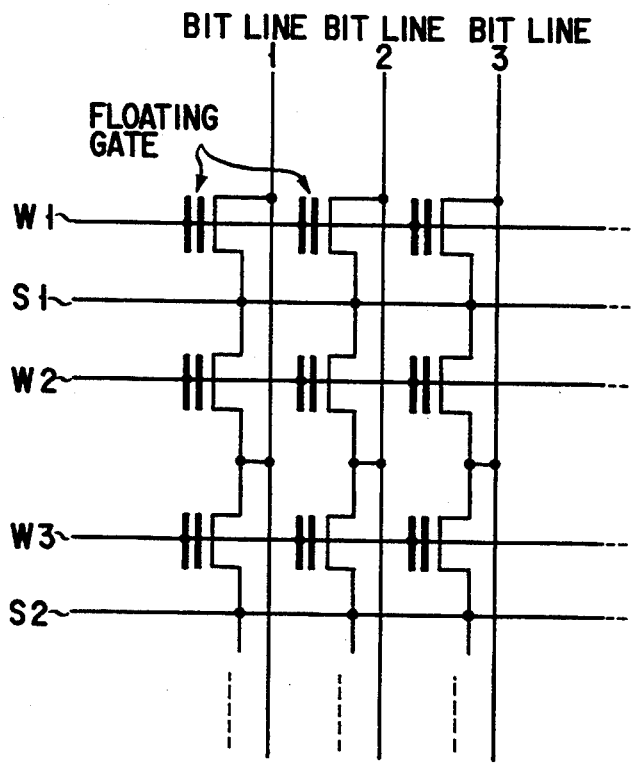
FIG. 1 is a circuit diagram of a conventional EEPROM.
Figure 2:
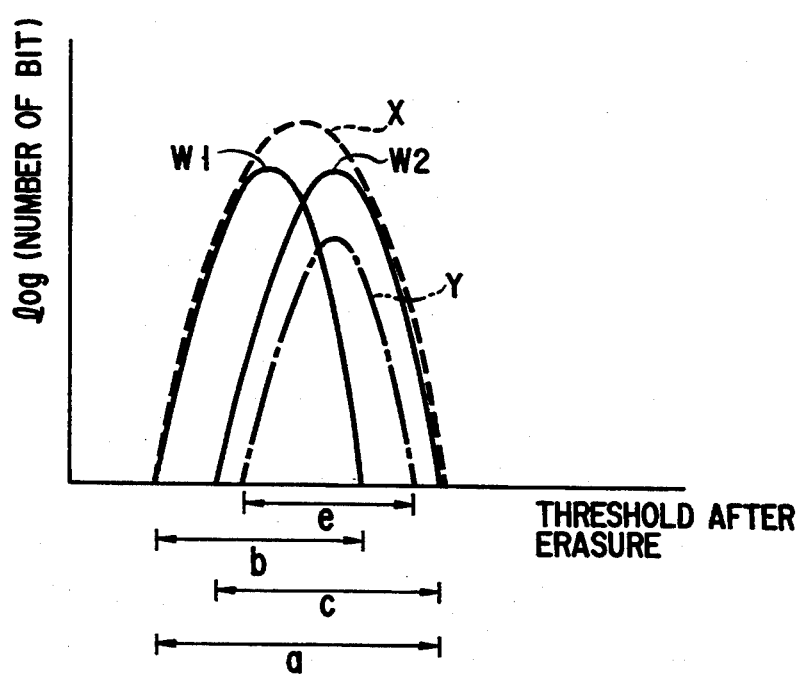
FIG. 2 is a diagram showing the threshold distribution of each cell in a memory cell array after erasing has been done.
Figures 3, 4:
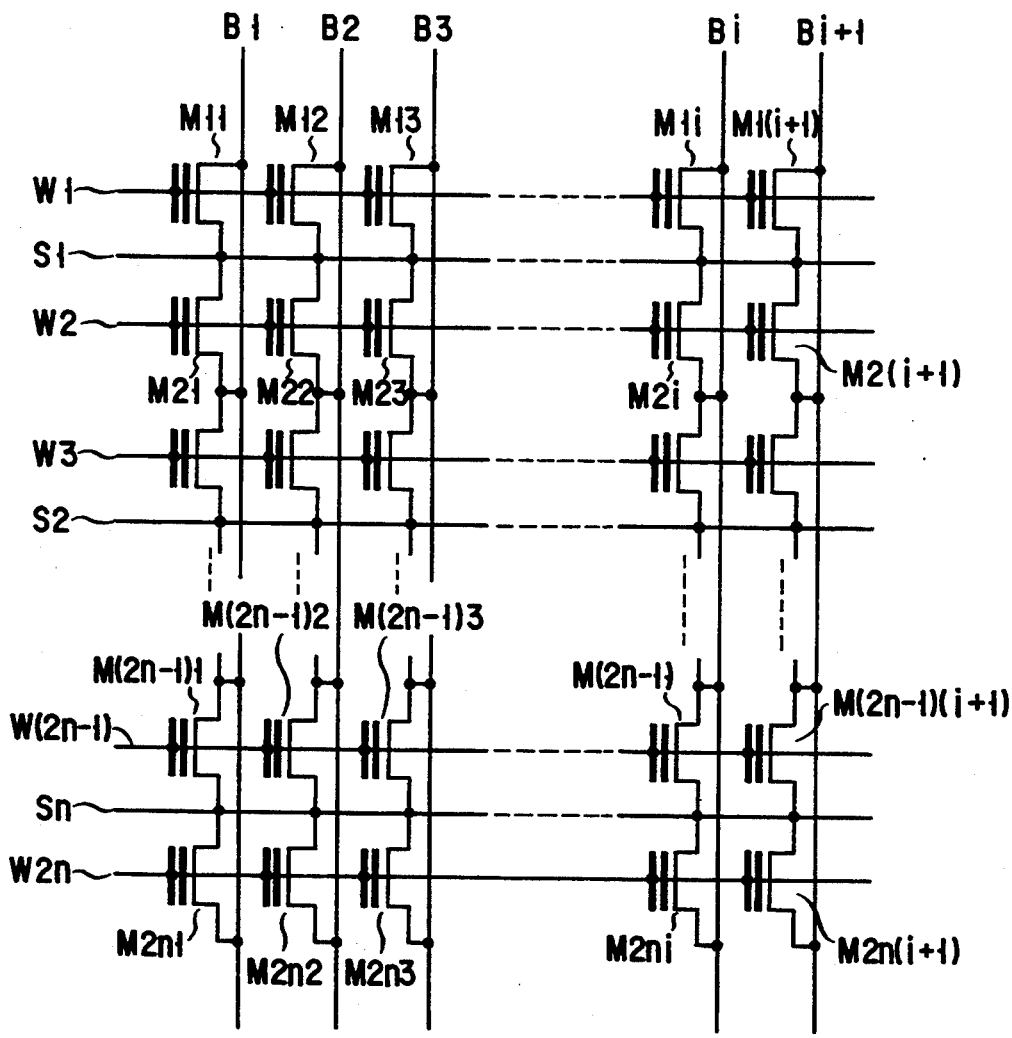
FIG. 3 is a circuit diagram of a flash EEPROM according to an embodiment of the present invention.
FIG. 4 is a table for explaining a method of erasing memory cells according to the present invention.

FIG. 3 shows a block structure of a flash EEPROM for embodying a method of the invention. A method of erasing the information in memory cells in the flash EEPROM will be explained. Since the arrangement of the flash EEPROM is the same as that of a conventional equivalent, its explanation will be omitted.

A word-line pair is made up of two word lines $W_{2n-1}$ and $W_{2n}$ sharing a single source $S_n$ where n is a natural number (n=1, 2, ... ). If the word-line pair is considered to be a unit, one memory cell array or one block will be composed of N (the largest of n) word-line pairs, that is, 2N word lines.

The source line $S_n$ is shared by memory cells $M_{(2n-1)1}$ through $M_{(2n-1)(i+1)}$ connected to word line $W_{2n-1}$ and memory cells $M_{2n-1}$ through $M_{2n(i+1)}$ connected to word line $W_{2n}$.

With the invention, the information in memory cells $M_{11}$ through $M_{1(i+1)}$, ..., $M_{(2n-1)1}$ through $M_{(2n-1)(i+1)}$ connected to word lines $W_1$ through $W_{2n-1}$, one half of N word-line pairs, and the information in memory cells $M_{21}$ through $M_{2(i+1)}$, ..., $M_{2n1}$ through $M_{2n(i+1)}$ connected to word lines $W_2$ through $W_{2n}$, the other half of N word-line pairs, are not erased simultaneously. As a result, the threshold distribution during the erasing of information can be made narrower.

The information in memory cells $M_{11}$ through $M_{1(i+1)}$, ..., $M_{(2n-1)1}$ through $M_{(2n-1)(i+1)}$ connected to word lines $W_1$ through $W_{2n-1}$, one half of N word-line pairs, is erased simultaneously. Further, the information in memory cells $M_{21}$ through $M_{2(i+1)}$, ..., $M_{2n-1}$ through $M_{2n(i+1)}$ connected to word lines $W_2$ through $W_{2n}$, the other half of N word-line pairs, is erased simultaneously. Therefore, the time required to erase information becomes shorter.

The method of this invention will be explained more concretely.

As shown in FIG. 4, to erase the information in memory cells $M_{(2n-1)1}$ through $M_{(2n-1)(i+1)}$ connected to word line $W_{2n-1}$, one half of one or multiple or all the word-line pairs, for example, a positive potential (5 V) is applied to the source line $S_n$, whereas, for example, a negative potential (−10 V) is applied to word line $W_{2n-1}$, the one half of the word-line pair or pairs. This enables the information in memory cells $M_{(2n-1)1}$ through $M_{(2n-1)(i+1)}$ connected to word line $W_{2n-1}$ to be erased in unison by F-N tunneling.

At this time, the potential of word line $W_{2n}$, the other half of the word-line pair or pairs, is set to such a potential as prevents the information in memory cells $M_{2n1}$ through $M_{2n(i+1)}$ connected to the word line $W_{2n}$ from being erased by F-N tunneling, for example, to the ground potential. The potential of bit line Bi (i=1, 2, ..) during the erasing of information may be in the floating state or at the ground potential.

Conversely, to erase the information in memory cells $M_{2n1}$ through $M_{2n(i+1)}$ connected to word line $W_{2n}$, the other half of the word-line pair or pairs, for example, a positive potential (5 V) is applied to the source line $S_n$, whereas, for example, a negative potential (−10 V) is applied to word line $W_{2n}$ of the other half of the word-line pair or pairs. This enables the information in memory cells $M_{2n1}$ through $M_{2n(i+1)}$ connected to word line $W_{2n}$ to be erased in unison by F-N tunneling.

At this time, the potential of word line $W_{2n+1}$, the one half of the word-line pair or pairs, is set to such a potential as prevents the information in memory cells $M_{(2n-1)1}$ through $M_{(2n-1)(i+1)}$ connected to the word line $W_{2n+1}$ from being erased by F-N tunneling, for example, to the ground potential. The potential of bit line Bi (i=1, 2, ... ) during the erasing of information may be in the floating state or at the ground potential.

By the above method, the erasing of the information in a memory cell array or the memory cells composing one block constituting a memory cell array can be achieved by only two erasures: the erasing of the information in memory cells $M_{(2n-1)1}$ through $M_{(2n-1)(i+1)}$ connected to word line $W_{2n+1}$ (the first erasure) and the erasing of the information in memory cells $M_{2n1}$ through $M_{2n(i+1)}$ connected to word line $W_{2n}$ (the second erasure).

This makes the time required to erase the information in memory cells shorter than is needed in a conventional equivalent. In addition, the erasing of information in memory cells connected to word line $W_{2n+1}$ is achieved independently of that in memory cells connected to word line $W_{2n}$. As a result, the threshold distribution during the erasing of information is not affected by such factors as the misaligned stepper or anisotropic processes and can be made narrower.

In the above embodiment, the erasing of information in the memory cells is done by applying a constant potential to the source line $S_n$ and extracting electrons from the floating gate of the memory cells connected to one word line or the other word line of the word-line pair into the source line $S_n$ by an F-N tunneling phenomenon.

A method of the present invention can also be applied to an EEPROM with an erasure electrode for discharging electrons into the floating gate of the memory cell. In this case, by applying a constant potential to the erasure electrode instead of the source line $S_n$, the information in memory cells is erased as a result of electrons being extracted from the floating gate into the erasure electrode by an F-N tunneling phenomenon.

Further, a method of the invention can also be applied to a flash EEPROM with redundant memory cells for replacing defective memory cells. In this case, the redundant memory cell has the same construction as that of the memory cell shown in FIG. 3. Specifically, a single source line is shared by the redundant memory cells connected to one of the word-line pair and the redundant memory cells connected to the other of the word-line pair. If a defective memory cell occurs, the defective memory cell is replaced with a redundant memory cell.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method of erasing information in memory cells of a nonvolatile memory device comprising first memory cells connected to first word lines of a plurality of word-line pairs, second memory cells connected to second word lines of said plurality of word-line pairs, and a plurality of sources, each source shared by the first and second memory cells connected to the first and second word lines of one of said word-line pairs, comprising the steps of:

erasing the information in said first memory cells by simultaneously applying a positive potential to said sources, a negative potential to said first word lines of said plurality of word-line pairs, and a ground potential to said second word lines of said plurality of word-line pairs; and erasing the information in said second memory cells by simultaneously applying said positive potential to said sources, said negative potential to said second word lines of said plurality of word-line pairs, and said ground potential to said first word lines of said plurality of word line pairs.

2. A method of erasing information in memory cells according to claim 1, wherein said erasing steps are achieved by extracting electrons from floating gates of said first memory cells and said second memory cells, respectively, into said sources by a Fowler-Nordheim tunneling phenomenon.

3. A method of erasing information in memory cells according to claim 1, wherein said ground potential is sufficient to prevent electrons from floating gates of said first memory cells or said second memory cells from being extracted into said sources by a Fowler-Nordheim tunneling phenomenon.

4. A method of erasing information in memory cells according to claim 1, wherein the first and second memory cells constitute redundant memory cells for replacing defective memory cells.

5. A method of erasing information in memory cells of a nonvolatile memory device comprising first memory cells connected to first word lines of a plurality of word-line pairs, second memory cells connected to second word lines of said plurality of word-line pairs, a plurality of sources, each source shared by the first and second memory cells connected to the first and second word lines of one of said word-line pairs, and erasure electrodes for erasing the information in the first and second memory cells, comprising the steps of:

erasing the information in said first memory cells by simultaneously applying a positive potential to said erasure electrodes, a negative potential to said first word lines of said plurality of word-line pairs, and a ground potential to said second word lines of said plurality of word-line pairs; and erasing the information in said second memory cells by simultaneously applying said positive potential to said erasure electrodes, said negative potential to said second word lines of said plurality of word-line pairs, and said ground potential to said first word lines of said plurality of word-line pairs.

6. A method of erasing information in memory cells according to claim 5, wherein said erasing steps are achieved by extracting electrons from floating gates of said first memory cells and said second memory cells, respectively, into said erasure electrodes by a Fowler-Nordheim tunneling phenomenon.

7. A method of erasing information in memory cells according to claim 5, wherein said ground potential is sufficient to prevent electrons from floating gates of said first memory cells or said second memory cells from being extracted into said erasure electrodes by a Fowler-Nordheim tunneling phenomenon.

8. A method of erasing information in memory cells according to claim 5, wherein the first and second memory cells constitute redundant memory cells for replacing defective memory cells.

9. A method of erasing information in memory cells according to claim 1, wherein the positive potential is 5 V and the negative potential is $-10$ V.

10. A method of erasing information in memory cells according to claim 5, wherein the positive potential is 5 V and the negative potential is $-10$ V.

11. A method of erasing information in memory cells of a nonvolatile memory device comprising first memory cells connected to first word lines of a plurality of word-line pairs, second memory cells connected to second word lines of said plurality of word-line pairs, and a plurality of sources, each source shared by the first and second memory cells connected to the first and second word lines of one of said word-line pairs, comprising the steps of:

erasing the information in said first memory cells by simultaneously applying a first potential to said sources, a second potential lower than the first potential to said first word lines of said plurality of word-line pairs, and a third potential lower than the first potential and higher than the second potential to said second word lines of said plurality of word-line pairs; and erasing the information in said second memory cells by simultaneously applying said first potential to said sorces, said second potential to said second word lines of said plurality of word-line pairs, and said third potential to said first word lines of said plurality of word-line pairs.

12. A method of erasing information in memory cells according to claim 11 wherein said erasing steps are achieved by extracting electrons from floating gates of said first and second memory cells, respectively, into said sources by a Fowler-Nordheim tunneling phenomenon.

13. A method of erasing information in memory cells according to claim 11, wherein said third potential is sufficient to prevent electrons from floating gates of said first memory cells or said second memory cells from being extracted from said sources by a Fowler-Nordheim tunneling phenomenon.

14. A method of erasing information in memory cells according to claim 11, wherein the first and second memory cells constitute redundant memory cells for replacing defective memory cells.

15. A method of erasing information in memory cells according to claim 11, wherein the first potential is 5 V, the second potential is $-10$ V, and the third potential is ground potential.

* * * * *